US012604395B2

(12) United States Patent
Yukiiri

(10) Patent No.: US 12,604,395 B2
(45) Date of Patent: Apr. 14, 2026

(54) METHOD OF MAKING AN INTERCONNECT SUBSTRATE

(71) Applicant: SHINKO ELECTRIC INDUSTRIES CO., LTD., Nagano (JP)

(72) Inventor: Yuji Yukiiri, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 197 days.

(21) Appl. No.: 18/488,140

(22) Filed: Oct. 17, 2023

(65) Prior Publication Data

US 2024/0155760 A1 May 9, 2024

(30) Foreign Application Priority Data

Nov. 4, 2022 (JP) ................................. 2022-177222

(51) Int. Cl.
| | |
|---|---|
| *H05K 3/00* | (2006.01) |
| *H05K 1/02* | (2006.01) |
| *H05K 1/11* | (2006.01) |
| *H05K 3/38* | (2006.01) |
| *H05K 3/42* | (2006.01) |

(52) U.S. Cl.
CPC ........... *H05K 1/0271* (2013.01); *H05K 1/113* (2013.01); *H05K 3/0035* (2013.01); *H05K 3/0055* (2013.01); *H05K 3/381* (2013.01); *H05K 3/429* (2013.01); *H05K 2201/0129* (2013.01); *H05K 2201/0263* (2013.01); *H05K 2203/095* (2013.01)

(58) Field of Classification Search
CPC .... H05K 3/0035; H05K 3/0055; H05K 3/381; H05K 3/429; H05K 2203/095; H05K 3/4673; H05K 2201/0263; H05K 2201/0209; Y10T 29/49155; Y10T 29/49165
See application file for complete search history.

(56) References Cited

U.S. PATENT DOCUMENTS

| | | | | | |
|---|---|---|---|---|---|
| 8,217,278 | B2 * | 7/2012 | Yu | ............................ | H05K 3/465 |
| | | | | | 174/262 |
| 8,367,943 | B2 * | 2/2013 | Wu | ........................ | H05K 3/4602 |
| | | | | | 174/262 |
| 10,849,233 | B2 * | 11/2020 | Bahl | ........................ | H05K 3/422 |
| 2009/0288870 | A1 * | 11/2009 | Kondo | .................... | H05K 3/381 |
| | | | | | 205/125 |

FOREIGN PATENT DOCUMENTS

| | | |
|---|---|---|
| JP | 2002-050603 | 2/2002 |

* cited by examiner

*Primary Examiner* — Donghai D Nguyen
(74) *Attorney, Agent, or Firm* — IPUSA, PLLC

(57) ABSTRACT
A method of making an interconnect substrate includes forming a first insulating layer containing a filler and covering a first interconnect layer, forming a via hole in the first insulating layer by laser processing, the via hole exposing the first interconnect layer, performing a heat treatment, plasma processing, and a desmear process in this order with respect to the first insulating layer, and forming, after the desmear process, a second interconnect layer including both an interconnect pattern formed on an upper surface of the first insulating layer and a via interconnect formed in the via hole.

9 Claims, 7 Drawing Sheets

METHOD OF MAKING AN INTERCONNECT SUBSTRATE

CROSS-REFERENCE TO RELATED APPLICATIONS

The present application is based on and claims priority to Japanese Patent Application No. 2022-177222 filed on Nov. 4, 2022, with the Japanese Patent Office, the entire contents of which are incorporated herein by reference.

FIELD

The disclosures herein relate to interconnect substrates and methods of making the same.

BACKGROUND

In the manufacturing of an interconnect substrate, an insulating layer covering an interconnect layer may be formed, and a via hole exposing the interconnect layer may be formed in the insulating layer by a laser processing method. After the via hole is formed, a resinous residue of the insulating layer may be left in the via hole. Such a resinous residue may cause a conduction failure or the like when another interconnect layer is formed on the insulating layer. In consideration of this, a desmear process is performed to remove the resinous residue (see, for example, Patent Document 1).

Forming a via hole in an insulating layer by a laser processing method results in thermal energy being also applied to the upper surface of the insulating layer around the via hole. As a result, heat-induced stress remains in the portion of the insulating layer close to the upper surface thereof. As this stress is released by the desmear process, a crack may occur in the insulating layer around the via hole.

Accordingly, there may be a need to provide a method of making an interconnect substrate in which cracks are unlikely to occur in an insulating layer around a via hole.

[Patent Document 1] Japanese Laid-open Patent Publication No. 2002-50603

SUMMARY

According to an aspect of the embodiment, a method of making an interconnect substrate includes forming a first insulating layer containing a filler and covering a first interconnect layer, forming a via hole in the first insulating layer by laser processing, the via hole exposing the first interconnect layer, performing a heat treatment, plasma processing, and a desmear process in this order with respect to the first insulating layer, and forming, after the desmear process, a second interconnect layer including both an interconnect pattern formed on an upper surface of the first insulating layer and a via interconnect formed in the via hole.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 1 is a partial cross-sectional view illustrating an example of an interconnect substrate according to an embodiment;

DESCRIPTION OF EMBODIMENTS

Figure 2A:
FIGS. 2A through 2D are drawings (part 1) illustrating an example of the steps of making the interconnect substrate according to the embodiment.

In the following, embodiments for carrying out the invention will be described with reference to the accompanying drawings. In the drawings, the same elements are denoted by the same reference numerals, and a duplicate description thereof may be omitted.

[Structure of Interconnect Substrate]

Figure 1:
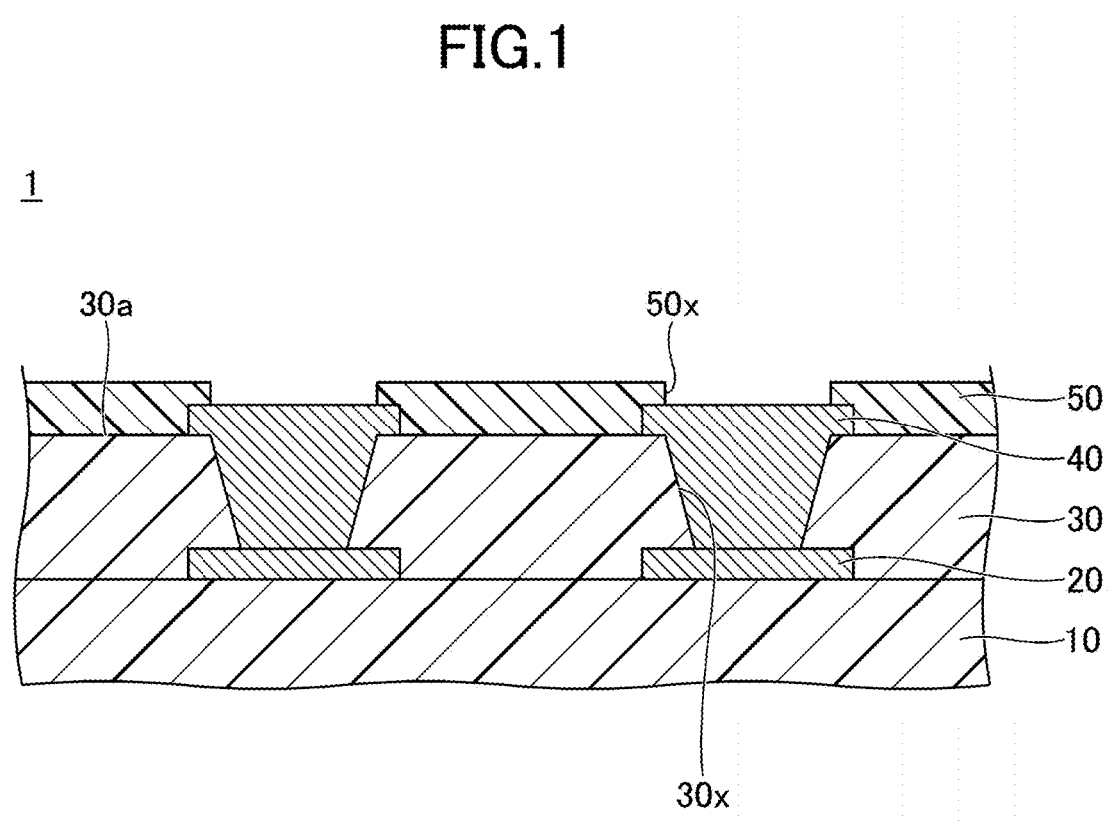

FIG. 1 is a partial cross-sectional view illustrating an example of an interconnect substrate according to an embodiment Referring to FIG. 1, the interconnect substrate 1 includes an insulating layer 10, an interconnect layer 20, an insulating layer 30, an interconnect layer 40, and a solder resist layer 50. The interconnect substrate 1 may be coreless or may have a core. The solder resist layer 50 may optionally be provided according to need.

In the present embodiment, for the convenience of explanation, the same side of the interconnect substrate 1 as the insulating layer 30 is referred to as an upper side, and the same side thereof as the insulating layer 10 is referred to as a lower side. A surface of each element on the upper side is referred to as an upper surface, and a surface thereof on the lower side is referred to as a lower surface. However, the interconnect substrate 1 may be placed upside-down when used, or may be arranged at b an any angle. In addition, a plan view refers to a view of an object as seen in the direction normal to the upper surface 30a of the insulating layer 30, and a plane shape refers to the shape of an object viewed along the direction normal to the upper surface 30a of the insulating layer 30.

The insulating layer 10 may be formed by, for example, a build-up method as an interlayer insulating layer of a multilayer interconnect. An additional interconnect layer and an additional insulating layer may be stacked as lower layers under the insulating layer 10. In such a case, via holes may be provided through the insulating layer 10 and the additional insulating layer, and the interconnect layers may be connected to each other through via interconnects disposed in the via holes.

The material of the insulating layer 10 may be, for example, an epoxy-based insulating resin, a polyimide-based insulating resin, or the like that is a non-photosensitive (thermosetting) resin. Alternatively, the material of the insulating layer 10 may be, for example, an epoxy-based insulating resin, an acrylic-based insulating resin, or the like that is a photosensitive resin. The insulating layer 10 may include a reinforcing material such as glass cloth. Further, the insulating layer 10 may contain a filler such as silica ($SiO_2$). The thickness of the insulating layer 10 may be, for example, about 10 μm to 50 μm.

The interconnect layer 20 is formed on the insulating layer 10. The material of the interconnect layer 20 may be, for example, copper (Cu) or the like. The thickness of the interconnect layer 20 may be, for example, about 10 μm to 30 μm. The interconnect layer 20 may have a laminate structure comprised of a plurality of metal layers.

The insulating layer 30 is formed on the b insulating layer 10 to cover the upper surface and side surface of the interconnect layer 20. The material of the insulating layer 30 may be, for example, an insulating resin similar to that of the insulating layer 10. The thickness of the insulating layer 30 may be, for example, the same as that of the insulating layer 10. The insulating layer 30 contains a filler. The filler contained in the insulating layer 30 is, for example, silica ($SiO_2$). The filler contained in the insulating layer 30 may alternatively be kaoline ($Al_2Si_2O_5$ ($OH)_4$), talc ($Mg_3Si_4O_{10}$ ($OH)_2$), alumina ($Al_2O_3$), or the like. The particle size of the filler may approximately be, for example, a minimum particle size of 0.1 μm, a maximum particle size of 5 μm, and an average particle size of 0.5 to 2 μm. Some of the fillers may be hollow.

The filler content may be, for example, 70% by weight or more. Use of the filler content of 70% by weight or more enables the reduction of loss tangent in the insulating layer 30, thereby realizing an insulating layer having a small electrical loss. Further, the use of the filler content of 70% by weight or more makes it possible for the coefficient of thermal expansion of the insulating layer 30 to be made similar to the coefficient of thermal expansion of Cu (about 17 ppm/° C.) or the like constituting the interconnect layer 20 and the interconnect layer 40, thereby enabling the reduction of warpage generated in the interconnect substrate 1.

The arithmetic average roughness Ra of the upper surface 30a of the insulating layer 30 is preferably greater than or equal to 200 nm and less than or equal to 350 nm. Use of the arithmetic average roughness Ra in this range reduces the likelihood of interconnect floating or the like, which enables the stable formation of an interconnect layer on the upper surface 30a of the insulating layer 30. Further, the b anchoring effect serves to improve the adhesion between the insulating layer 30 and the interconnect layer 40.

The interconnect layer 40 is formed on one side of the insulating layer 30 and is electrically connected to the interconnect layer 20. The interconnect layer 40 includes an interconnect pattern formed on the upper surface 30a of the insulating layer 30 and a via interconnect that is formed in a via hole 30x extending through the insulating layer 30 to expose the upper surface of the interconnect layer 20. The interconnect pattern formed on the upper surface 30a of the insulating layer 30 is electrically connected to the interconnect layer 20 through the via interconnect. The interconnect pattern may include a pad for external connection.

The via hole 30x may be a recess having an inverted truncated conical shape whose upper opening situated toward the interconnect layer 40 is larger in diameter than the lower opening thereof situated at the upper surface of the interconnect layer 20. The size of the upper opening of the via hole 30x may be, for example, about 30 μm to 80 μm. The thickness of the interconnect pattern constituting the interconnect layer 40 may be, for example, about 10 μm to 30 μm.

The peel strength of the interconnect layer 40 is preferably 300 gf/cm or more. With a peel strength of 300 gf/cm or more, sufficiently strong adhesion is provided between the interconnect layer 40 and the insulating layer 30.

The solder resist layer 50 is formed on the upper surface 30a of the insulating layer 30. The solder resist layer 50 has an opening 50x, and part of the interconnect layer 40 is exposed in the opening 50x. The plane shape of the opening 50x may be, for b example, a circle. The diameter of the opening 50x may properly be determined in accordance with what object (e.g., a chip, a motherboard, or the like) is to be connected.

The material of the solder resist layer 50 may be, for example, a photosensitive insulating resin containing a phenol-based resin, a polyimide-based resin, or the like as a main component. The solder resist layer 50 may contain a filler such as silica ($SiO_2$). An external connection terminal such as a solder ball may be formed on the interconnect layer 40 exposed in the opening 50x as such a need arises.

A surface-treated layer (not illustrated) may be formed on the upper surface of the interconnect layer 40 exposed in the opening 50x. Examples of the surface-treated layer include an Au layer, an Ni/Au layer (a metal layer made by stacking an Ni layer and an Au layer in this order), and an Ni/Pd/Au layer (a metal layer made by stacking an Ni layer, a Pd layer, and an Au layer in this order). The upper surface of the interconnect layer 40 exposed in the opening 50x may be subjected to an anti-oxidation treatment such as an organic solderability preservative (OSP) treatment to form a surface-treated layer.

[Method of Making Interconnect Substrate]

In the following, a method of making the interconnect substrate according to the present embodiment will be described. FIGS. 2A to 2D through FIGS. 4A and 4B are drawings illustrating an example of the steps of making the interconnect substrate according to the present embodiment. The present embodiment is directed to the steps of forming a single interconnect substrate, but it is also possible to form a plurality of portions to become respective interconnect substrates, followed by performing singulation to produce individual b interconnect substrates.

In the step illustrated in FIG. 2A, an insulating layer 10 is provided, and an interconnect layer 20 is formed on the upper surface of the insulating layer 10 by a well-known sputtering method, plating method, or the like.

Figure 2B:
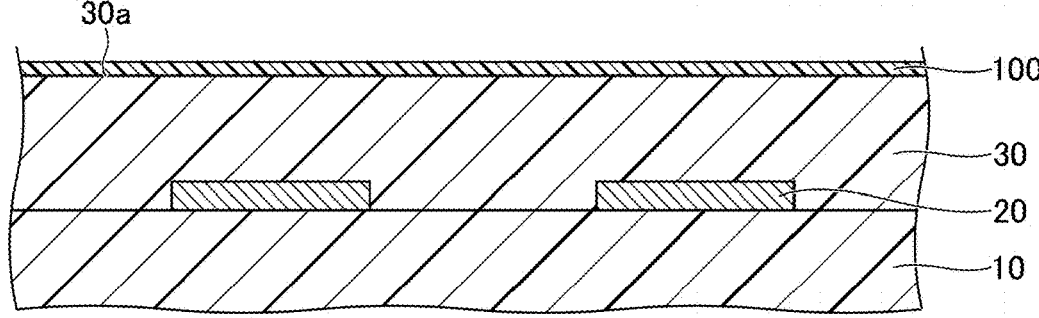

In the step illustrated in FIG. 2B, an insulating layer 30 that covers the interconnect layer 20 is formed on the insulating layer 10. The insulating layer 30 contains a filler. The filler content may be, for example, 70% by weight or more. Specifically, a thermosetting epoxy-based insulating resin film, for example, is prepared as the insulating layer 30, and is laminated on the upper surface of the insulating layer 10 to cover the interconnect layer 20. The insulating layer 30 is then cured by heat at a curing temperature or higher while pressing the laminated insulating layer 30.

Alternatively, a material for the insulating layer 30 is, for example, a thermosetting epoxy-based insulating resin liquid or paste, which is applied to the upper surface of the insulating layer 10 by a spin coating method or the like so as to cover the interconnect layer 20. The applied insulating resin is cured by heat at a curing temperature or higher to form the insulating layer 30.

A protective film 100 is preferably disposed on the upper surface 30a of the insulating layer 30. Examples of the protective film 100 include a polyethylene terephthalate film and a polyethylene naphthalate film. A peelable adhesive layer may be provided between the upper surface 30a of the insulating layer 30 and the protective film 100. The following description will be directed to an example in which the protective film 100 is disposed.

Figure 2C:
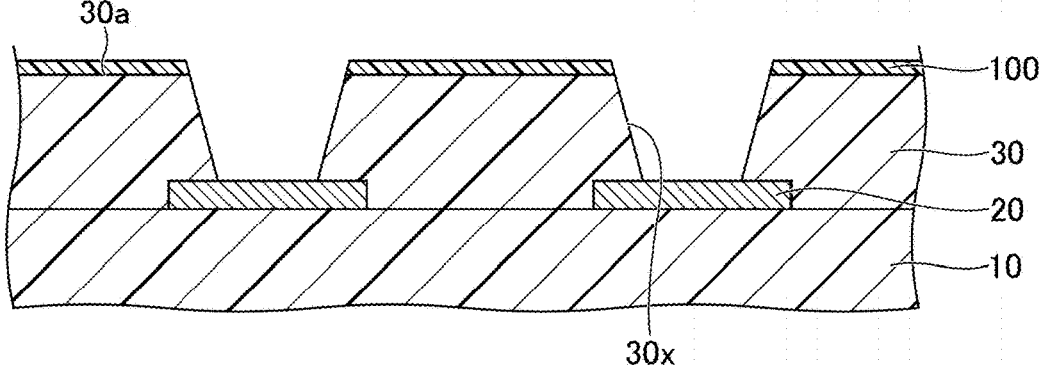

In the step illustrated in FIG. 2C, a via hole 30x that extends through the insulating layer 30 to expose the upper surface of the interconnect layer 20 is formed in the insulating layer 30. The via hole 30x may be formed by, for example, a laser processing method using a $CO_2$ laser or the like. That is, heat energy is applied to the insulating layer 30 by laser light irradiation through the protective film 100 to cause thermal destruction of the resin of the insulating layer 30, thereby forming the via hole 30x. At this time, heat energy is also applied to the upper surface 30a of the insulating layer 30 around the via hole 30x, so that thermal stress remains in the portion of the insulating layer 30 close to the upper surface 30a thereof. It may be noted that the stress remains regardless of whether the protective film 100 is present or absent.

The via hole 30x formed by the laser processing method is a recess having an inverted truncated conical shape whose upper opening situated toward the interconnect layer 40 is larger in diameter than the lower opening thereof situated at the upper surface of the interconnect layer 20. With the protective film 100 disposed on the upper surface 30a of the insulating layer 30, the power of the laser for irradiation can be increased. As a result, the ratio of the lower opening diameter to the upper opening diameter can be increased as compared with the case where the protective film 100 is not disposed. Moreover, the provision of the protective film 100 on the upper surface 30a of the insulating layer 30 reduces the likelihood of adhesion of a foreign substance or the like to the upper surface 30a of the insulating layer 30.

Figure 2D:
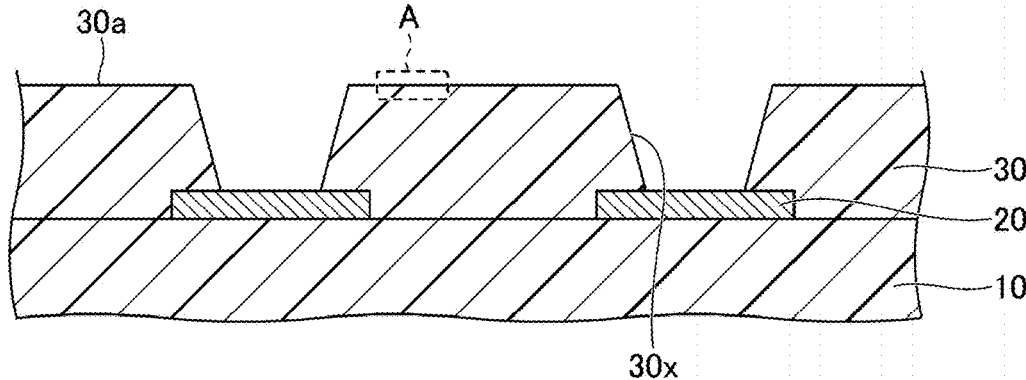

In the step illustrated in FIG. 2D, the protective film 100 is removed to expose the upper surface 30a of the insulating layer 30. The protective film 100 may be removed by, for example, mechanical detachment.

Figure 3A:
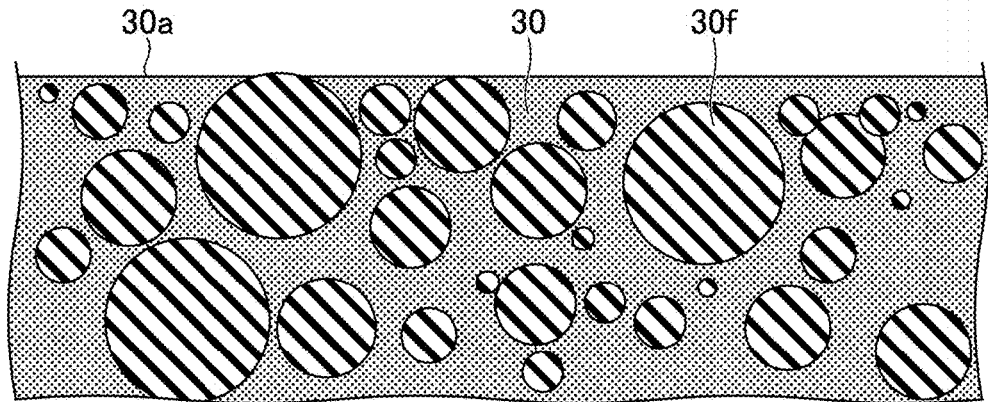
FIGS. 3A through 3C are drawings (part 2) illustrating the example of the steps of making the interconnect substrate according to the embodiment.
Figure 3B:
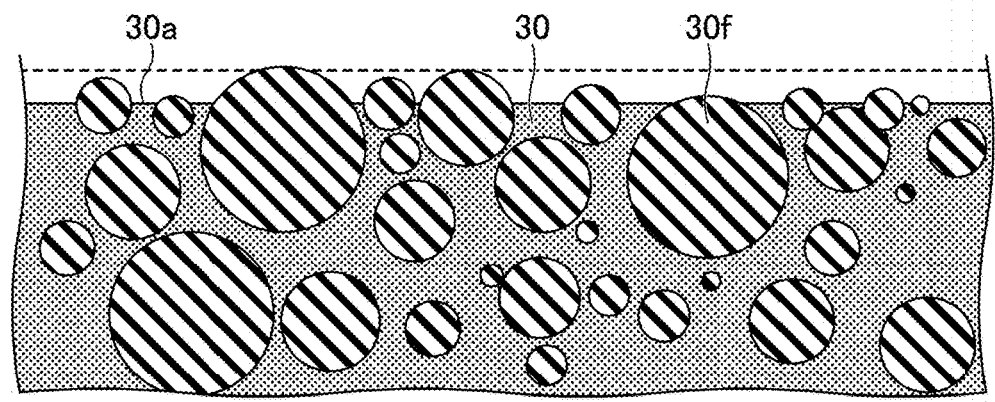
Figure 3C:
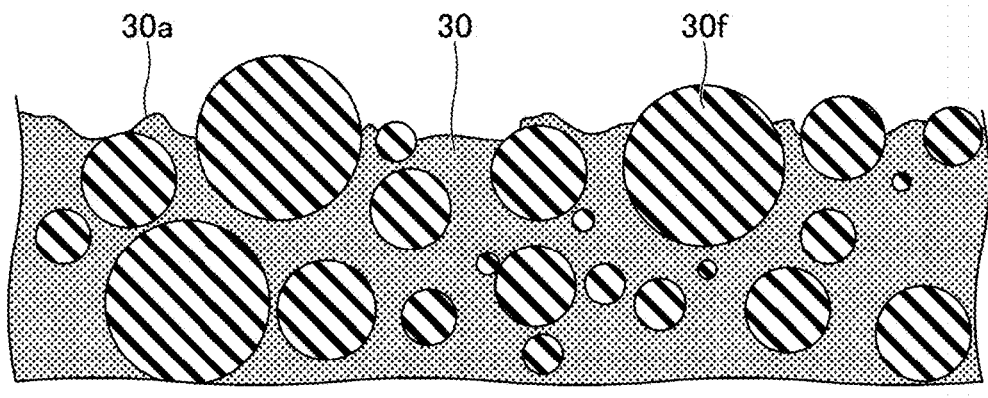

In the step illustrated in FIG. 3A, heat treatment is performed with respect to the entire insulating layer 30. The heat treatment is preferably performed at a temperature of 80° C. or more and 150° C. or less for a duration of 20 minutes to 80 minutes, inclusive. The heat treatment is more preferably performed at a temperature of 100° C. or more and 130° C. or less for a duration of 30 minutes to 60 minutes, inclusive. By performing the heat treatment at such a relatively low temperature for longer than a predetermined time, it is possible to release the stress remaining in the insulating layer 30 generated at the time of laser processing. Setting the heat treatment time to 80 minutes or less serves to prevent a resinous residue present in the via hole 30x from becoming excessively hard. This arrangement makes it possible to easily perform the desmear process, which will be described later. FIGS. 3A through 3C are enlarged views of a portion A in FIG. 2D, in which a reference character 30f designates a filler.

If the heat treatment step were not performed, the stress remaining in the insulating layer 30 generated at the time of laser processing would not be released. If the desmear process were performed while the stress remained, the stress remaining in the portion of the insulating layer 30 close to the upper surface 30a would be released at the time of etching, which would increase the risk that cracks might be generated around the via hole 30x. The more brittle the resin is, the more likely cracks occur due to stress caused by the releasing of stress. As the filler content of the insulating layer 30 increases, the resin component decreases, which likely causes a brittle state. In the case in which the filler content in the insulating layer 30 is 70% by weight or more, thus, providing the heat treatment step has a particular technical significance. It may be noted that a heat treatment lasting for 10 minutes or less is not able to release the stress remaining in the insulating layer 30 generated at the time of laser processing.

In the step illustrated in FIG. 3B, plasma processing is performed with respect to the entire insulating layer 30. The plasma processing may use, for example, a gas mixture of oxygen ($O_2$) and Tetrafluoromethane ($CF_4$). Use of a gas containing $O_2$ in the plasma processing causes the resin to be easily decomposed. In addition, the use of a gas containing $O_2$ in the plasma processing serves to oxidize the surfaces of the filler 30f, thereby increasing hydrophilicity. With this arrangement, an etchant used in the desmear process, which will be described later, can be uniformly spread on the upper surface 30a of the insulating layer 30, which results in the upper surface 30a being uniformly roughened.

The plasma processing selectively etches the resin in the upper surface 30a of the insulating layer 30, thereby lowering the position of the upper surface 30a as measured from the lower surface of the insulating layer 30. A dashed line in FIG. 3B indicates a portion removed by the plasma processing. The thickness of the resin portion etched by the plasma processing is, for example, about 1 μm to 2 μm. Since the filler 30f is not etched by the plasma processing, the resultant upper surface 30a of the insulating layer 30 is rich in the filler 30f. It may be noted that an Ar gas may be used for the plasma processing.

In the step illustrated in FIG. 3C, the desmear process is performed on the entire insulating layer 30. This process removes a resinous residue of the insulating layer 30 adhering to the upper surface of the interconnect layer 20 exposed at the bottom of the via hole 30x, and also roughens the upper surface 30a of the insulating layer 30. The arithmetic average roughness Ra of the upper surface 30a of the insulating layer 30 after the desmear process may be set to 200 nm or more and 350 nm or less.

The desmear process includes a wet etching step. The desmear process may include a swelling step prior to the wet etching step. In the swelling step, the insulating layer 30 including the via hole 30x is immersed in a swelling liquid for a predetermined time. This arrangement makes the resinous residue easily removable in the etching step. Further, swelling the insulating layer 30 serves to increase the adhesion between the insulating layer 30 obtained through the etching step and the interconnect layer 40 formed thereafter. The swelling step may be followed by the wet etching step. In the wet etching step, an etchant such as sodium permanganate or potassium permanganate, for example, may be used. After the wet etching step, a post-treatment (i.e., neutralization treatment) with a reducing agent solution is preferably performed.

Although the resinous residue is removed to some extent by the plasma processing alone, the resinous residue can be more reliably removed by performing the desmear process. In particular, as the insulating layer 30 becomes thicker, the via hole 30x becomes deeper, and, thus, the distance from the upper surface 30a of the insulating layer 30 to the bottom surface of the via hole 30x (i.e., the upper surface of the interconnect layer 20) becomes longer, which makes it more difficult for plasma energy to reach the bottom surface. By performing not only the plasma processing but also the desmear process, the resinous residue on the bottom surface of the via hole 30x is more reliably removed even when the insulating layer 30 is thick.

Figure 4A:
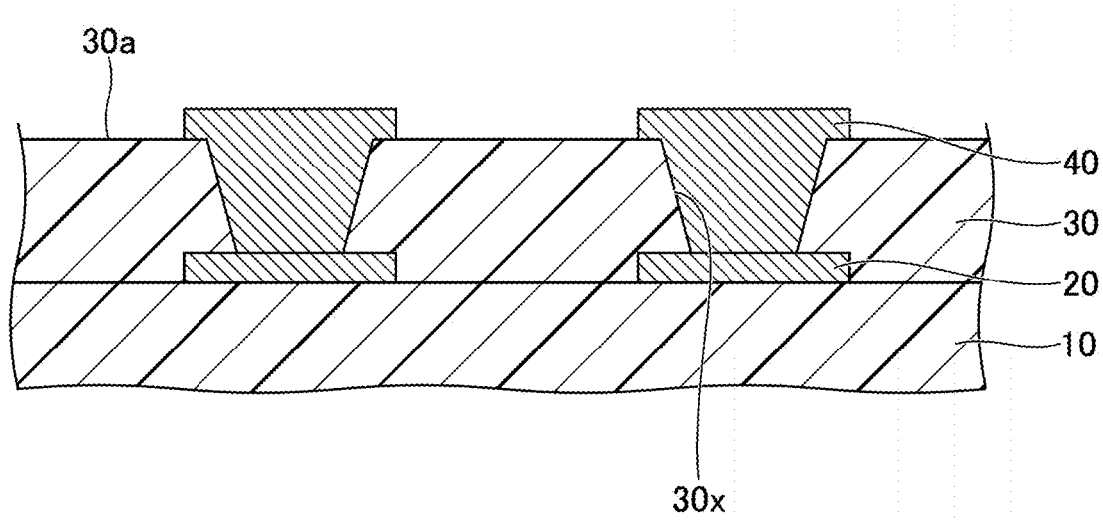
FIGS. 4A and 4B are drawings (part 3) illustrating the example of the steps of making the D interconnect substrate according to the embodiment.

In the step illustrated in FIG. 4A, the b interconnect layer 40 is formed on one side of the insulating layer 30. The interconnect layer 40 may be formed by, for example, a semi-additive method. Specifically, a seed layer is continuously formed on the upper surface of the interconnect layer 20 exposed at the bottom of the via hole 30x, the inner surface of the via hole 30x, and the upper surface 30a of the insulating layer 30 by electroless plating or sputtering. A resist layer having an opening corresponding to the interconnect layer 40 is then formed on the seed layer. An electrolytic plating layer is formed in the opening of the resist layer by an electrolytic plating method using the seed layer as a power feeding layer.

Subsequently, the resist layer is removed, and a portion of the seed layer which is not covered with the electrolytic plating layer is removed by etching using the electrolytic plating layer as a mask. With this arrangement, the interconnect layer 40 is formed as the seed layer and the electrolytic plating layer stacked thereon. The interconnect layer 40 includes an interconnect pattern formed on the upper surface 30a of the insulating layer 30 and a via interconnect formed in the via hole 30x that extends through the insulating layer 30 to expose the upper surface of the interconnect layer 20. The peel strength of the interconnect layer 40 after the step of forming the interconnect layer 40 may be 300 gf/cm or more.

The seed layer may be, for example, a laminate film in which a titanium layer and a copper layer are stacked in this order. The electrolytic plating layer may be, for example, a copper layer. The thickness of the seed layer may be, for example, about 0.2 μm to 1.0 μm. The thickness of the electrolytic plating layer situated on the upper surface 30a of the insulating layer 30 may be, for b example, about 10 μm to 30 μm.

Figure 4B:
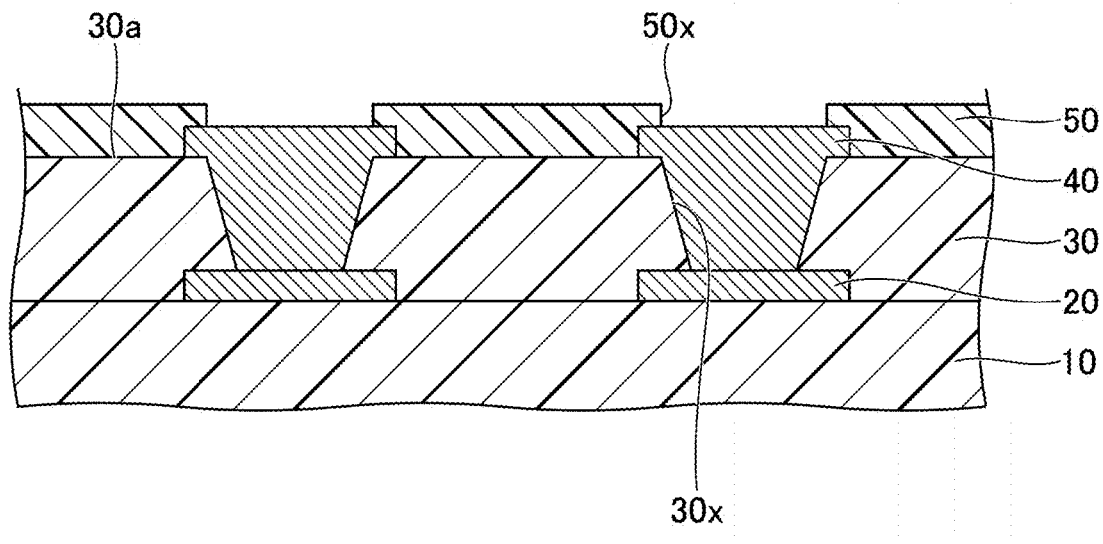

In the step illustrated in FIG. 4B, a solder resist layer 50 having an opening 50x is formed on the insulating layer 30. The solder resist layer 50 may be formed by, for example, applying a liquid or paste of photosensitive epoxy-based insulating resin or acrylic-based insulating resin to the upper surface 30a of the insulating layer 30 to cover the interconnect layer 40 by screen printing, roll coating, spin coating, or the like. Alternatively, a photosensitive epoxy-based insulating resin film or acrylic-based insulating resin film, for example, may be laminated on the upper surface 30a of the insulating layer 30 to cover the interconnect layer 40.

The solder resist layer 50 is then exposed and developed to form an opening 50x in the solder resist layer 50 (photolithography method) to expose a portion of the upper surface of the interconnect layer 40. The opening 50x may be formed by a laser processing method or blasting. In such a case, a photosensitive material may not be used for the solder resist layer 50.

In the above-described step, a metallic layer as previously described may be formed on the upper surface of the interconnect layer 40 exposed at the bottom of the opening 50x by electroless plating or the like, for example. Instead of forming the metal layer, an anti-oxidation treatment such as an OSP treatment may be performed. Through the steps heretofore described, the interconnect substrate 1 is obtained in final form.

In the manner described above, the method of making the interconnect substrate 1 includes the heat treatment step, the plasma processing step, and the desmear process step. As previously described, performing the heat treatment enables the releasing of stresses that is generated in the insulating layer 30 around the via hole 30x at the time of laser processing, and, thus, reduces the likelihood of cracks in the insulating layer 30 around the via hole 30x. In the following, the technical significance of providing the plasma processing step after the heat treatment step will be described with reference to a comparative example.

Figure 5A:
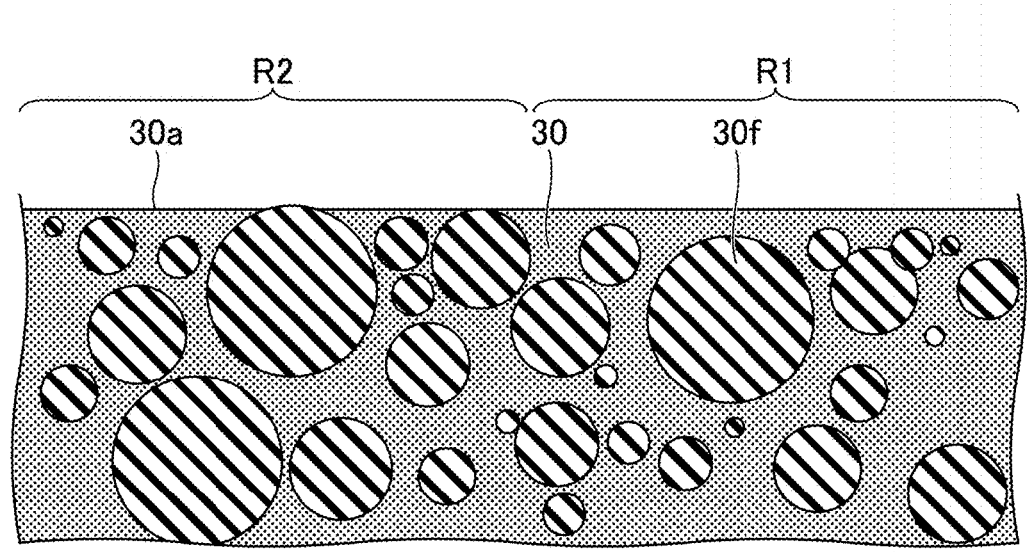
FIGS. 5A and 5B are drawings illustrating part of the steps of making an interconnect substrate according to a comparative example.
Figure 5B:
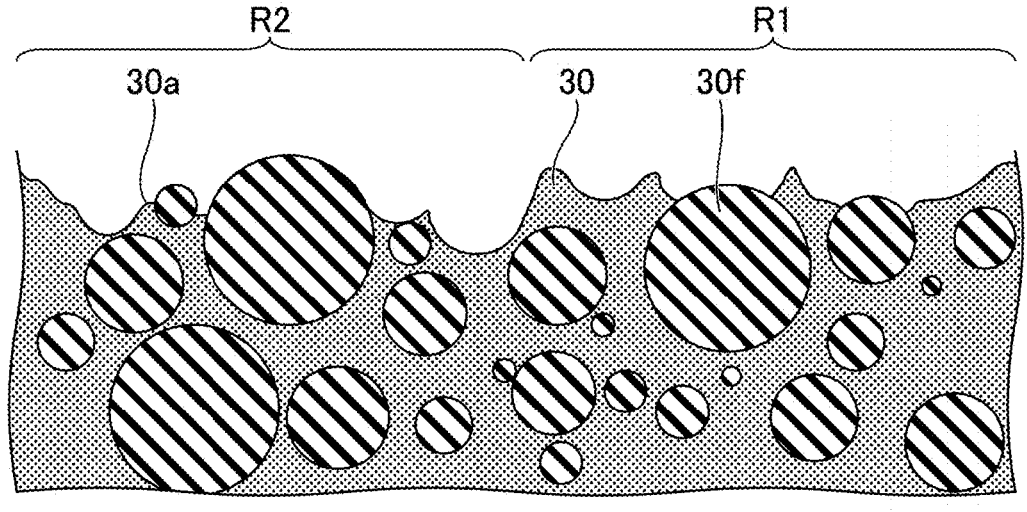

FIGS. 5A and 5B are drawings illustrating part of the steps of making an interconnect substrate according to a comparative example. The steps of making an interconnect substrate according to the comparative example is the same as the steps of making the interconnect substrate 1 from FIG. 2A to FIG. 3A.

FIG. 5A illustrates a portion of the insulating layer 30 around the upper surface 30a after the heat treatment. In FIG. 5A, R1 indicates a resin-rich region, and R2 indicates a non-resin-rich region. As the resin constituting the insulating layer 30 hardens by the heat treatment, the resin-rich region R1 appears in which the resin is predominant near the upper surface, and the non-resin-rich region R2 appears in which the resin is not predominant near the upper surface. When the desmear process is performed in this state, the situation in the region R1 is such that only the resin component near the upper surface is etched, with only a small amount of filler being exposed, and, thus, roughening does not readily proceed. In contrast, the situation in the region R2 is such that a large amount of filler breaks free of the upper surface in conjunction with etching, and, thus, roughening readily proceeds. That is, the resin-rich region R1 is difficult to roughen, and the non-resin-rich region R2 is easy to roughen.

After the heat treatment is performed in the step of FIG. 5A, a desmear process is performed in the step illustrated in FIG. 5B. In the steps of b making an interconnect substrate according to the comparative example, the plasma processing is not performed between the heat treatment and the desmear process. As described above, the region R1, which has a thick layer of the resin component hardened by the heat treatment, is not sufficiently etched by the desmear process alone. In the region R1, thus, not much of the filler is exposed, which reduces the occurrence of surface irregularities (i.e., roughness) caused by breaking-off of the filler. That is, the desmear process causes an uneven degree of roughness (i.e., unevenness of roughening) on the upper surface 30a of the insulating layer 30. The arithmetic average roughness Ra of the upper surface 30a of the insulating layer 30 varies within a range of about 50 nm to 300 nm, inclusive. As the unevenness of roughening occurs in the upper surface 30a of the insulating layer 30, a formation defect occurs that causes an electrical short-circuit in the interconnect patterns or pads of the interconnect layer 40 formed on the upper surface 30a of the insulating layer 30, thereby reducing the reliability of connection in the interconnect substrate.

In contrast, the steps of making the interconnect substrate 1 include the plasma processing performed between the heat treatment and the desmear process. This plasma processing selectively etches the resin in the upper surface 30a of the insulating layer 30. That is, the regions varying in susceptibility to roughening by the heat treatment are removed by etching, so that the susceptibility to roughening of the upper surface 30a of the insulating layer 30 approaches the same level regardless of regions.

As the desmear process is performed in this state, the upper surface 30a of the insulating layer 30 is roughened. In this case, however, the difference b in the amount of filler exposed by the desmear process between the region R1 and the region R2 is reduced, as compared with the comparative example involving no plasma processing. As a result, variation in the roughness of the upper surface 30a of the insulating layer 30 can be reduced. The arithmetic average roughness Ra of the upper surface 30a of the insulating layer 30 is within a range of about 200 nm to 350 nm, inclusive. Since the variation in the roughness of the upper surface 30a of the insulating layer 30 is reduced, a formation failure that causes an electrical short-circuit is less likely to occur in the interconnect patterns or pads of the interconnect layer 40 formed on the upper surface 30a of the insulating layer 30, which improves the reliability of connection in the interconnect substrate 1. Further, the reduced variation in the roughness of the upper surface 30a of the insulating layer 30 serves to improve the peel strength.

Like the interconnect substrate of the comparative example, a plurality of interconnect substrates X were made, with respect to which the desmear process was performed without performing the plasma processing. Also, a plurality of interconnect substrates 1 were made, with respect to which the desmear process was performed after performing the plasma processing. Comparisons between these substrates were made with respect to the roughness of the upper surface 30a of the insulating layer 30 and the peel strength of the interconnect layer 40. The roughness of the upper surface 30a of the insulating layer 30 was obtained by non-contact measurement using an optical interferometry method. The peel strength of the interconnect layer 40 was measured in accordance with JIS C6481 by pulling the interconnect layer 40 with a width of 1 cm in a direction perpendicular to the upper surface 30a of the b insulating layer 30 at a pulling rate of 50 mm/min, and measuring the force (gf/cm) required to peel the interconnect layer 40 from the insulating layer 30.

Figure 6A:
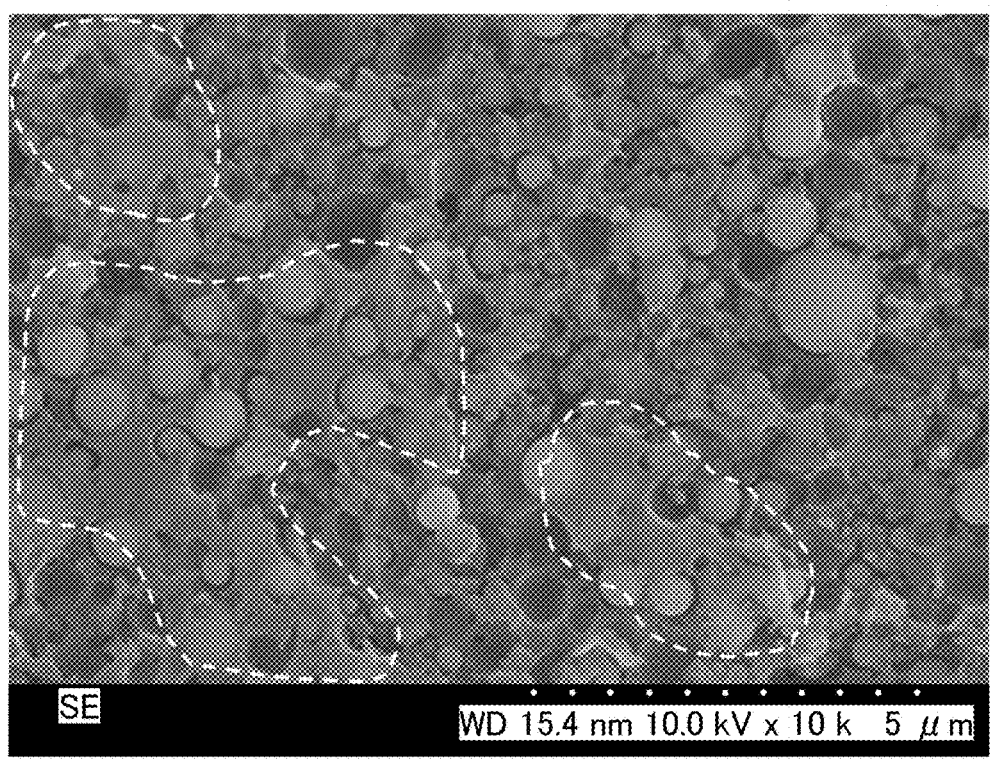
FIGS. 6A and 6B are drawings showing SEM images of the upper surface of an insulating layer after a desmear process.
Figure 6B:
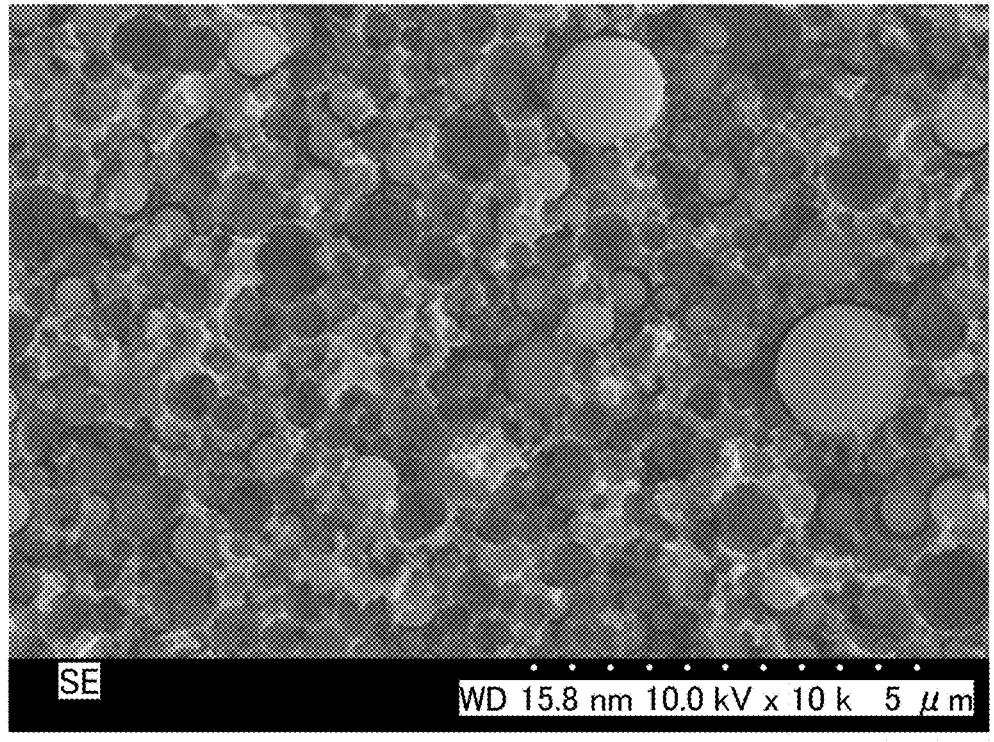

FIGS. 6A and 6B are drawings showing SEM images of an upper surface of an insulating layer after a desmear process. FIG. 6A is a SEM image of an interconnect substrate according to the comparative example. As can be seen, the regions surrounded by the dashed lines contain more resin than the regions not surrounded by the dashed lines. That is, unevenness of roughening occurred in the upper surface 30a of the insulating layer 30. In contrast, FIG. 6B is a SEM image of the interconnect substrate 1, in which the resin-rich region was not observed. It can be confirmed that variation in the roughness of the upper surface 30a of the insulating layer 30 was reduced, as compared with FIG. 6A.

Figure 7A:
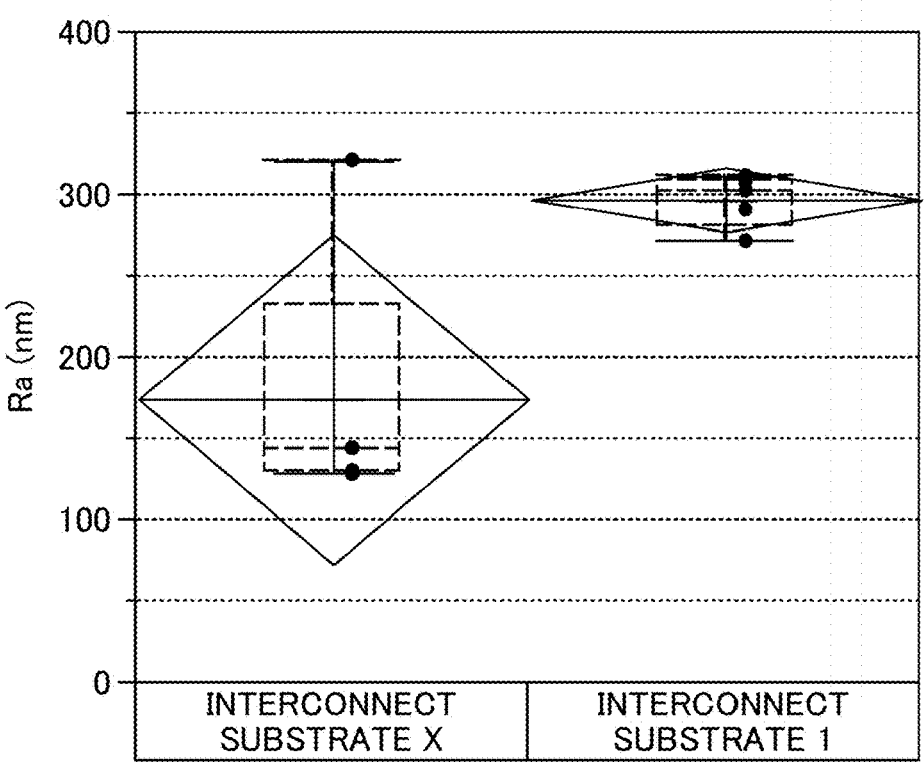
FIGS. 7A and 7B are drawings illustrating comparisons with respect to roughness and peel strength.
Figure 7B:
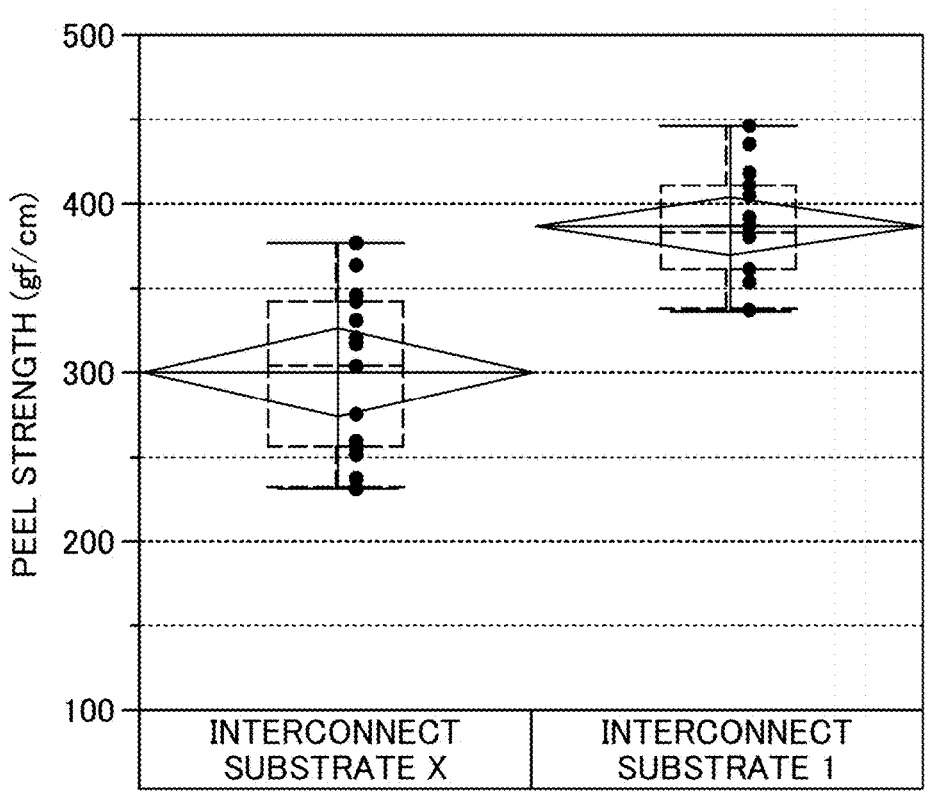

FIGS. 7A and 7B are drawings illustrating comparisons with respect to roughness and peel strength. FIG. 7A provides comparisons in Ra data between the interconnect substrates X and the interconnect substrates 1. As can be seen, the interconnect substrates X had smaller values of Ra and a larger variation in the value of Ra than the interconnect substrates 1. To be more specific, Ra of the interconnect substrates X varies in a range of about 120 nm to 320 nm. In contrast, the interconnect substrates 1 had a variation within a range of about 270 nm to 310 nm, and the difference from the interconnect substrates X is apparent. The results shown in FIG. 7A coincide with the results shown in FIGS. 6A and 6B.

FIG. 7B provide comparisons in peel strength data between the interconnect substrates X and the interconnect substrates 1. As can be seen, the interconnect substrates 1 had higher peel strength than the interconnect substrates 1. To be b more specific, the peel strength of the interconnect substrates X was in a range of about 230 gf/cm to 380 gf/cm. In contrast, the interconnect substrates 1 had peel strength in a range of about 330 gf/cm to 450 gf/cm, which provides an improvement by an average of about 80 gf/cm over the interconnect substrates X.

According to the disclosed technique, it is possible to provide a method of manufacturing an interconnect substrate in which cracks are less likely to occur in an insulating layer located around a via hole.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A method of making an interconnect substrate, comprising:

forming a first insulating layer containing a filler and covering a first interconnect layer;

forming a via hole in the first insulating layer by laser processing, the via hole exposing the first interconnect layer;

performing, after the forming of the via hole, a heat treatment, plasma processing, and a desmear process in this order with respect to the first insulating layer; and forming, after the desmear process, a second interconnect layer including both an interconnect pattern formed on an upper surface of the first insulating layer and a via interconnect formed in the via hole.

2. The method of making an interconnect substrate as claimed in claim 1, wherein an arithmetic average roughness Ra of an upper surface of the first insulating layer after the desmear process is 200 nm or more and 350 nm or less.

3. The method of making an interconnect substrate as claimed in claim 1, wherein a peel strength of the second interconnect layer after the forming of the second interconnect layer is 300 gf/cm or more.

4. The method of making an interconnect substrate as claimed in claim 1, wherein a content of the filler in the first insulating layer 70% by weight or more.

5. The method of making an interconnect substrate as claimed in claim 1, wherein the plasma processing involves using a gas mixture of oxygen and tetrafluoromethane.

6. The method of making an interconnect substrate as claimed in claim 1, wherein the heat treatment is performed at a temperature of 80° C. to 150° C., inclusive, for a duration of 20 minutes to 80 minutes, inclusive.

7. The method of making an interconnect substrate as claimed in claim 1, wherein the desmear process includes a wet etching process.

8. The method of making an interconnect substrate as claimed in claim 1, further comprising:

disposing a protective film on an upper surface of the first insulating layer; and removing the protective film before the heat treatment, wherein the forming of the via hole includes irradiating the first insulating layer with laser light through the protective film to form the via hole.

9. The method of making an interconnect substrate as claimed in claim 1, wherein each of the plasma processing and the desmear process etches an upper surface of the insulating layer.

* * * * *